(12) United States Patent
Brumett, Jr. et al.

(10) Patent No.: US 9,059,684 B2
(45) Date of Patent: Jun. 16, 2015

(54) GATE CONTROL CIRCUIT

(71) Applicant: Silego Technology, Inc., Santa Clara, CA (US)

(72) Inventors: Thomas D. Brumett, Jr., San Jose, CA (US); Marcelo Martinez, Davis, CA (US); John Othniel McDonald, Mountain House, CA (US)

(73) Assignee: Silego Technology, Inc., Santa Clara, CA (US)

( * ) Notice: Subject to any disclaimer, the term of this patent is extended or adjusted under 35 U.S.C. 154(b) by 0 days.

(21) Appl. No.: 14/085,733

(22) Filed: Nov. 20, 2013

(65) Prior Publication Data

US 2014/0152351 A1 Jun. 5, 2014

Related U.S. Application Data

(63) Continuation of application No. 13/607,498, filed on Sep. 7, 2012, now Pat. No. 8,618,847, which is a continuation of application No. 13/189,397, filed on Jul. 22, 2011, now Pat. No. 8,283,953, which is a continuation of application No. 12/590,326, filed on Nov. 4, 2009, now Pat. No. 8,008,953.

(60) Provisional application No. 61/198,707, filed on Nov. 7, 2008.

(51) Int. Cl.
*H03K 17/296* (2006.01)
*H03K 3/012* (2006.01)
*H03K 17/16* (2006.01)

(52) U.S. Cl.
CPC .............. *H03K 3/012* (2013.01); *H03K 17/166* (2013.01)

(58) Field of Classification Search
USPC ................ 327/134, 170–175, 392–394, 538, 327/540–544
See application file for complete search history.

(56) References Cited

U.S. PATENT DOCUMENTS 5,742,193 A * 4/1998 Colli et al. .................... 327/170
5,828,245 A * 10/1998 Brambilla et al. ............ 327/108
8,008,953 B1 * 8/2011 Brumett et al. ............... 327/109

* cited by examiner

*Primary Examiner* — An Luu
(74) *Attorney, Agent, or Firm* — Van Pelt, Yi & James LLP

(57) ABSTRACT

An integrated circuit for switching a transistor is disclosed. In some embodiments, an operational amplifier is configured to drive a transistor, and slew rate control circuitry is configured to control the slew rate of the transistor source voltage during turn on. The transistor source voltage is employed as feedback to the operational amplifier to facilitate closed loop control of the transistor source voltage during switching of the transistor.

21 Claims, 7 Drawing Sheets

GATE CONTROL CIRCUIT

CROSS REFERENCE TO OTHER APPLICATIONS

This application is a continuation of U.S. patent application Ser. No. 13/607,498, entitled GATE CONTROL CIRCUIT filed Sep. 7, 2012 which is incorporated herein by reference for all purposes, which is a continuation of U.S. patent application Ser. No. 13/189,397, now U.S. Pat. No. 8,283,953, entitled GATE CONTROL CIRCUIT filed Jul. 22, 2011 which is incorporated herein by reference for all purposes, which is a continuation of U.S. patent application Ser. No. 12/590,326, now U.S. Pat. No. 8,008,953 entitled GATE CONTROL CIRCUIT filed Nov. 4, 2009, which is incorporated herein by reference for all purposes, which claims priority to U.S. Provisional Patent Application No. 61/198,707 entitled FET GATE DRIVER filed Nov. 7, 2008, which is incorporated herein by reference for all purposes.

BACKGROUND OF THE INVENTION

Various power management techniques are employed in systems in order to minimize power consumption and consequently conserve energy and prolong battery life. Improved techniques for power conservation are useful so that systems can meet more stringent energy conservation requirements.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims, and the invention encompasses numerous alternatives, modifications, and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

Power savings policies are typically employed in computer systems and dictate the manner in which various facilities of a computer system are placed into and brought out of sleep states based on user and/or application activity. For example, the Advanced Configuration and Power Interface (ACPI) specification provides a comprehensive regime defining power management in computer systems and is often employed as an industry standard for power management. During periods of inactivity, various functions and their corresponding components are turned or powered off and/or placed into appropriate sleep states. When activity levels increase, these components must be quickly turned back on but turned on in a controlled manner to minimize perturbations and noise in the system.

Figure 1:
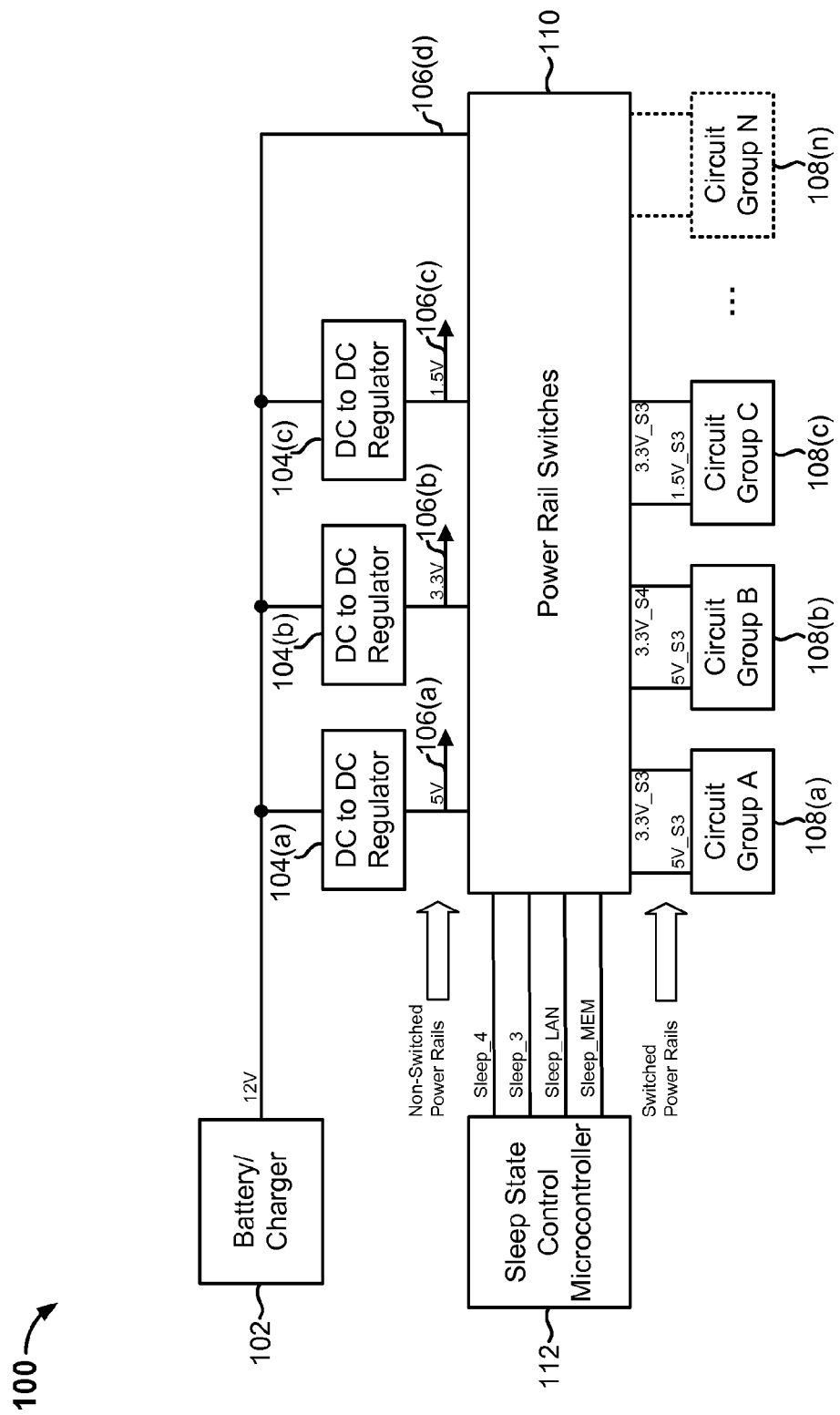
FIG. 1 is a block diagram illustrating an embodiment of a power system of a notebook computer.

FIG. 1 is a block diagram illustrating an embodiment of at least a portion of a power system 100 of a notebook computer. As depicted, a 12V bus emanating from battery/charger 102 is stepped down by DC to DC converters 104 to source operating voltages required by components on the motherboard. In the given example, power rails 106 provide operating voltages of 5V, 3.3V, 1.5V, and 12V. The appropriate power rails 106 are connected to various circuit groups 108 via power rail switches 110. During an active or on-state of a circuit group, the power rail switches corresponding to the power rails needed by the circuit group are switched on so that the appropriate power rails are connected to the circuit group. However, during an inactive or sleep state of a circuit group, the power rail switches corresponding to the power rails not currently needed by the circuit group are switched off to disconnect the power rails from the circuit group so that power consumption can be reduced. Appropriately switching the various power rail switches off and on as various system components are put into and brought out of sleep states is managed by higher level system functions such as the operating system and executed by a sleep state control microcontroller 112. As illustrated in the given example, microcontroller 112 outputs various sleep state signals to control power rail switches 110. In some embodiments, power rail switches 110 comprise semiconductor switches such as FETs (Field Effect Transistors).

Figure 2:
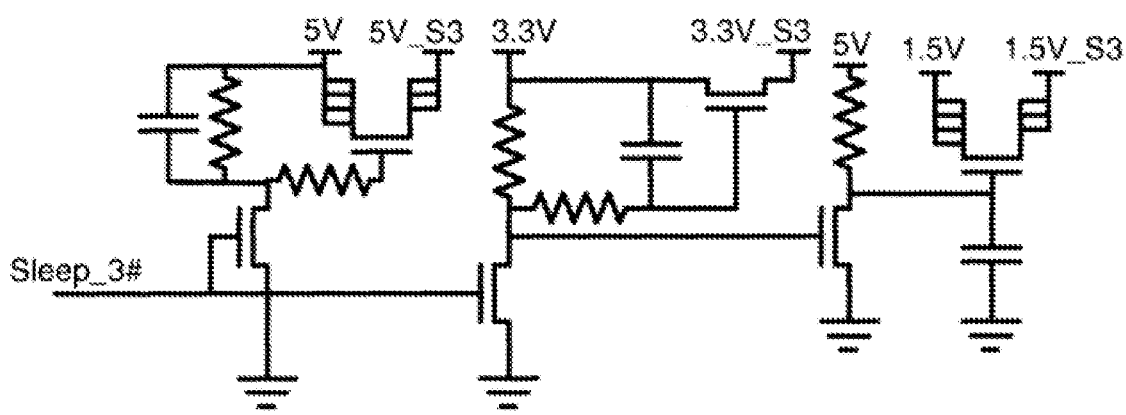
FIG. 2 is a circuit diagram illustrating typical circuitry used to perform sleep state 3 power rail switching in a notebook computer.

A FET switch associated with a power rail is typically switched on and off using discrete components such as RC (resistor/capacitor) networks. FIG. 2 is a circuit diagram illustrating typical circuitry used to perform sleep state 3 power rail switching in a notebook computer. For example, the circuitry in the given example is used to control the turn-on of power FETs when waking up from sleep state 3. The power FETs are turned on in a controlled manner in order to mitigate switching transients and to limit inrush current magnitude. Typically, the turn-on control of a power FET comprises a delay (e.g., in the range of 1-2 ms) and a ramp up time (e.g., in the range of 1-2 ms). Controlled delays and ramp rates are set by the discrete RC elements. In the example of FIG. 2, a sleep state control signal (Sleep_3#) as well as non-switched power rails (5V, 3.3V, and 1.5V) and corresponding switched power rails (5V_S3, 3.3V_S3, and 1.5V_S3) are depicted. The switched power rails, for example, may comprise supply voltages to a VLSI device supplying core voltage, I/O voltage, internal memory array voltage, etc.

Many disadvantages exist in using discrete components to switch power FETs. For example, the circuitry currently used for power rail switching (e.g., the circuitry of FIG. 2) typically comprises a large number of discrete components, which occupy considerable board space. Moreover, the RC networks used to delay FET turn-on comprise open loops, which may result in a non-monotonic application of voltage to a device, which should be avoided. As described, potentially detrimental transients during turn-on such as current and/or voltage spikes are controlled by selecting appropriate delay and ramp rate values with appropriate R and C values. However, the extent to which power FETs gracefully turn-on is to a large degree a function of the loads on the switched power rails. Thus, whenever changes are made to the load circuit groups, the RC delay and ramp networks need to be re-examined and possibly adjusted by motherboard designers to assure that the power rails are properly controlled during switching. Furthermore, delay and/or ramp times need to be padded to ensure proper operation over varying system conditions that may affect the performance and accuracy of various components such as capacitors, which vary significantly over temperature. In many cases, however, the pad times added to delay and/or ramp times result in unnecessary power consumption and latency. Discrete components also consume substantial power even during quiescent states, i.e., when a FET being controlled is fully turned on or off. In order to reduce quiescent state power consumption, additional transistors and other passive components would need to be added (e.g., to the circuitry of FIG. 2) which would in turn increase the component count, board space, and cost of the circuitry. A typical motherboard includes a substantial number of power FETs, compounding the complexity.

Improved circuitry for switching transistors (e.g., FETs) is disclosed. The operational amplifier based integrated circuit described herein for switching a FET eliminates discrete components from a rail switch network and provides an extremely low power, closed loop solution for controlling a FET. The FET gate control circuitry described provides controlled FET on ramp and delay times that are independent of changing load conditions and eliminates the need for delay and ramping pad times, resulting in reduced power consumption and latency during switching. Moreover, specifics in the design result in very low quiescent power consumption due to no active power (only leakage) being consumed by the gate control circuitry whenever a FET being controlled is fully turned on or fully turned off. The quiescent power consumption of some embodiments of these devices, for example, is well below 1 µA. Furthermore, the gate control circuitry described herein provides a lower component count, more compact, more reliable, and less costly alternative to the discrete component network of FIG. 2.

Although many of the examples described herein are with respect to power rail switching in a computer system, the techniques described herein may be employed with respect to any application and may be employed to control the switching of any appropriate switching component, i.e., the described techniques are not limited to switching power FETs. Other possible applications include, for example, hot-plugging of cables, cards, or modules into connectors or processors in non-stop computing applications. The described techniques may be employed with respect to any situation in which it is desirable to ensure that power supply to components is applied to devices in a controlled manner so as not to cause system errors.

Figure 3A:
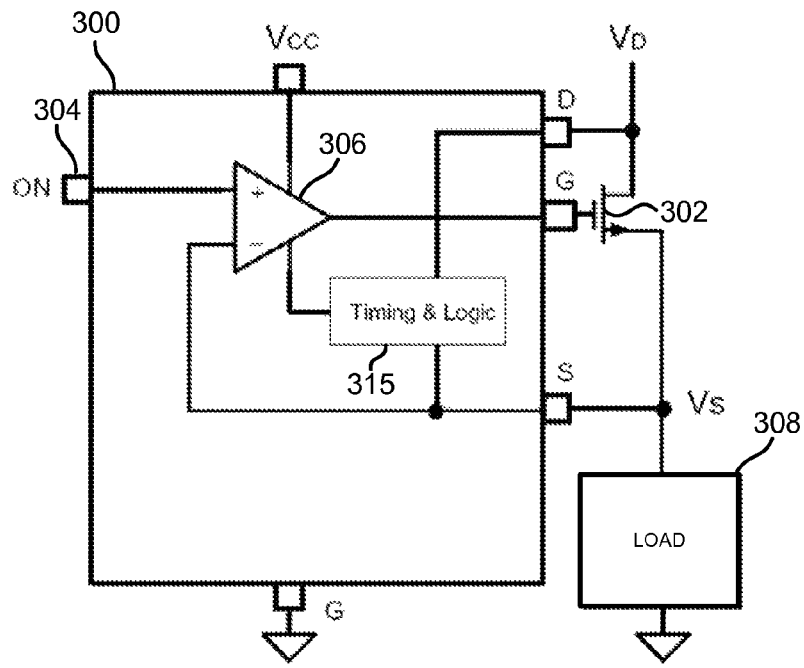
FIG. 3A is a high level functional block diagram of an embodiment of a gate control circuit.

FIG. 3A is a high level functional block diagram of an embodiment of a gate control circuit. Gate control circuit 300 comprises an operational amplifier based integrated circuit that provides closed loop control of the turn on and turn off of an external FET 302. For example, FET 302 may comprise an N-channel or a P-channel FET. In the given example, gate control circuit 300 comprises a six pin chip. In some embodiments, FET 302 comprises a power rail switch, and gate control circuit 300 is employed as a control element for switching the power rail. In the given example, asserting logic signal 304 from a de-asserted state causes operational amplifier 306 to begin driving the gate of FET 302 after a pre-configured internally controlled delay period expires. That is, voltage is not applied to the gate of FET 302 until after the delay period in order to turn on FET 302 in a more controlled manner. The delay period is set by internal delay control circuitry (not shown in FIG. 3A) integrated into gate control circuit 300. After the delay period expires, the gate voltage is ramped up at a slew rate determined by internal slew rate control circuitry (not shown in FIG. 3A) integrated into gate control circuit 300. The source voltage (Vs) of FET 302 is employed as feedback to operational amplifier 306 to ensure that smooth, monotonically increasing voltage is delivered to load 308 at a controlled rate determined by the internal ramp. Monotonic rise of the source voltage is maintained while turning on FET 302 even when the source current increases dramatically after the load device 308 turn-on threshold voltage is reached and/or load filter capacitors are charged. Load 308 may comprise any device or computer system component, such as a graphics chip, where it is desirable to switch on and off the device's power source. In the context of power rail switching, gate control circuit 300 facilitates monotonically increasing slew up of a corresponding power rail voltage when FET 302 is switched on, e.g., when load device 308 is powered on or wakened from a sleep state. Operational amplifier 306 of gate control circuit 300 is designed and/or may be selected to support a wide range of FETs associated with a wide variety of load conditions and turn-on regimes. In some embodiments, gate control circuit 300 also includes internal discharge control circuitry that, for example, provides a controlled path to remove charge from opened power rails and discharge load filter capacitors. De-asserting logic signal 304 from an asserted state turns off FET 302. The voltage at load 308 is discharged through a discharge control path (not shown in FIG. 3A) internal to gate control circuit 300.

Figure 3B:
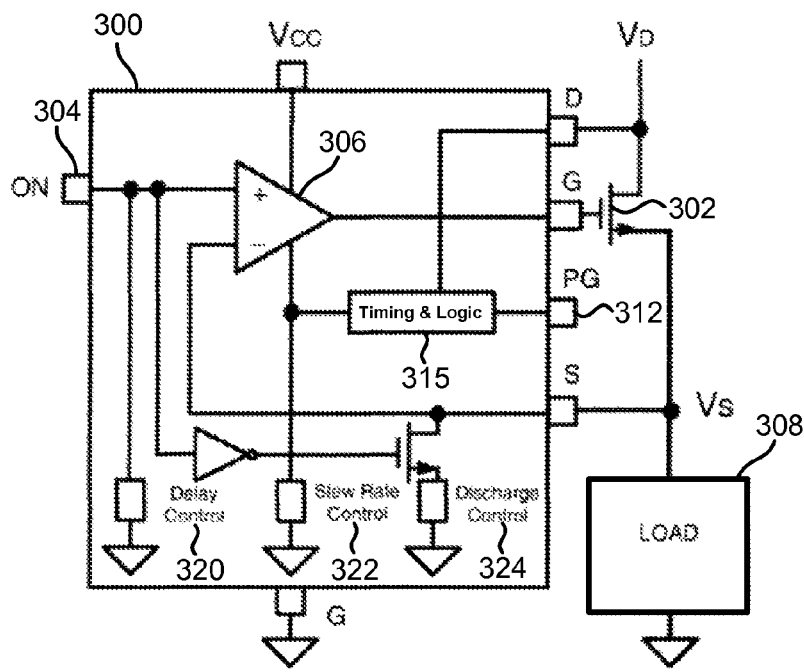
FIG. 3B is a high level functional block diagram of an embodiment of a gate control circuit.

FIG. 3B is a high level functional block diagram of an embodiment of a gate control circuit. Gate control circuit 300 of FIG. 3B is similar to gate control circuit 300 of FIG. 3A but depicts functional blocks for integrated delay control, slew rate control, and discharge control circuitry. In various embodiments, the delay control, slew rate control, and discharge control circuitry may be implemented in any appropriate manner. Moreover, the circuitry may be selected and/or configured to provide any appropriate or desired delay time, slew rate, and/or discharge rate values. In some embodiments, delay time, slew rate, and/or discharge rate values of a gate control circuit are selected and/or set during fabrication when the chip is manufactured, e.g., the values are mask programmable. Alternatively, in some embodiments, a gate control circuit may be manufactured to support variable and/or ranges of delay time, slew rate, and/or discharge rate values, which provides users with the flexibility of selecting appropriate or desired values post-fabrication. In some such cases, for example, user selections may be programmed into on-chip flash or other non-volatile memory.

Delay control circuitry 320 and slew rate control circuitry 322 of the gate control circuit facilitate a delayed turn on and ramping slew rate of the gate voltage and, in turn, the source voltage. It is also important for the control circuitry to perform predictably in cases where either a drain voltage is not yet present or when power to the control circuitry is applied some time after the control signal ON is asserted. Since the source voltage is applied to load 308, controlled turn on of the source voltage is important to prevent or at least mitigate voltage and current switching transients. The non-inverting input of operational amplifier 306 is connected to slew rate control circuitry 322, and the inverting input of operational amplifier 306 is connected to the FET source voltage. Delay control circuitry 320 sets a fixed time delay before FET 302 is started to be driven by operational amplifier 306 through slew rate control circuitry 322, e.g., in response to logic signal 304 becoming asserted. In some embodiments, delay control circuitry 320 may comprise of digital counters and/or resistor/capacitor based timing elements. The time delay set by delay control circuitry 320 is independent of FET drain voltage ($V_D$), FET source voltage ($V_S$), and the gate control circuit supply voltage (Vcc). In some embodiments, the time delay is a device configuration parameter. In some such cases, for example, time delay values in the range of 0-100 s of microseconds or 0-10 s of milliseconds may be selected. At the expiration of the time delay implemented by delay control circuitry 320, operational amplifier 306 begins driving FET 302 via application of voltage to the gate of FET 302. In some embodiments, the time delay is not started until a voltage has been placed on the gate of FET 302 to a level above its turn-on threshold. Slew rate control circuitry 322 controls ramp up of the gate voltage, and in turn the source voltage, of FET 302 as it is turned on. Feedback of the source voltage into operational amplifier 306 provides closed loop control of the source voltage slew rate during turn-on which is important for controlling dv/dt induced transients, i.e., for ensuring that a smooth, monotonically increasing voltage with little or no overshoot or oscillations is provided to load 308 as well as ensuring that the current into load 308 does not exhibit massive dv/dt induced spikes which would occur if the FET were quickly turned on. In some embodiments, slew rate control circuitry 322 may comprise of digital counters and/or resistor/capacitor based timing elements. Of course, the time to slew the source voltage to fully on is a function of the drain supply voltage. In some embodiments, the slew rate is a device configuration parameter. In some such cases, for example, source voltage slew rate values in the range of 0.5-8V/ms may be selected. In other cases, much quicker slew rate values on the order of 80V/ms may be required. The control electronics, therefore, need to be flexible to support a wide range of slew rates. To further optimize efficiency, in some embodiments, the gate of FET 302 is driven on to at least a prescribed voltage (e.g., 8V) above the source voltage which is sufficient to ensure a substantially low $R_{DS-ON}$ (i.e., FET resistance while on). Discharge control circuitry 324 controls discharge of the voltage at load 308 when FET 302 is turned off, e.g., in response to logic signal 304 becoming de-asserted. In some embodiments, discharge control circuitry 324 may comprise of a current limited path through an internal resistor to ground. In some embodiments, the discharge rate is a device configuration parameter. In some such cases, discharge impedance values ranging from 400-1000 Ω equivalent resistance, current limited to a prescribed value of 10 to 50 mA or an open may be selected, and the discharge current may be limited to a maximum prescribed value (e.g., 10 mA).

Figure 3C:
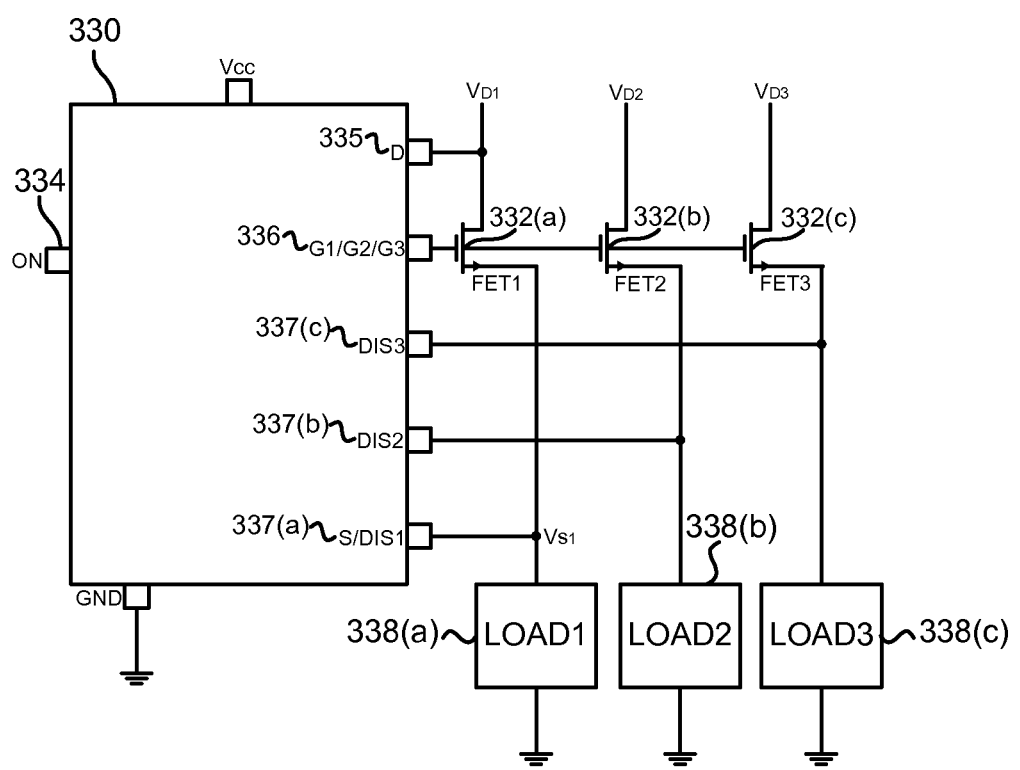
FIG. 3C is a high level functional block diagram of an embodiment of a gate control circuit.

FIG. 3C is a high level functional block diagram of an embodiment of a gate control circuit. The operation and circuitry of gate control circuit 330 is similar to that described for gate control circuit 300 of FIGS. 3A-3B. Gate control circuit 330, however, is employed to switch a plurality of FETs 332, which, for example, may be associated with a plurality of power rails. Specifically, gate control circuit 330 in the example of FIG. 3C controls the simultaneous turn on and turn off of three FETs 332(a)-(c). The output 336 of the operational amplifier (not shown in FIG. 3C but similar to operational amplifier 306 in FIGS. 3A-3B) of gate control circuit 330 drives the gates of FETs 332, e.g., at an internally controlled slew rate after the expiration of an internally set delay period, when logic signal 334 becomes asserted from a de-asserted state. The FET drain connection 335 and FET source connection 337(a) of gate control circuit 330 are connected to the drain and source of the FET with the highest $V_D$ voltage, i.e., FET 332(a) in the given example. In some embodiments, only one of the FETs, e.g., 332(a), is ramp controlled. Although the other FETs, e.g., 332(b) and 332(c), share the same gate control, their turn on is open loop. Discharge connections 337(a)-(c) of gate control circuit 330 are connected to the FET sources so that the voltage at each load can be discharged via an appropriate discharge path (not shown in FIG. 3C) in gate control circuit 330 when logic signal 334 becomes de-asserted from an asserted state.

Figure 4:
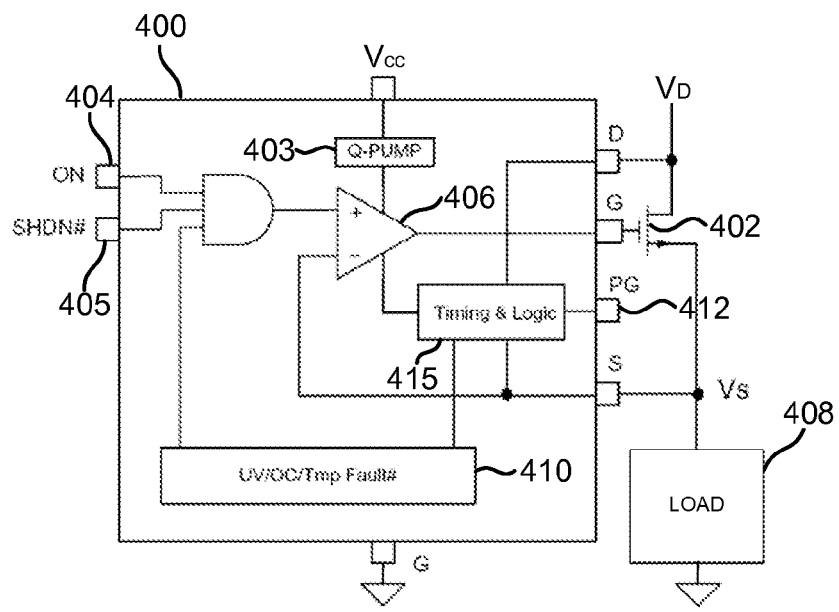
FIG. 4 is a high level functional block diagram of an embodiment of a gate control circuit.

FIG. 4 is a high level functional block diagram of an embodiment of a gate control circuit. Gate control circuit 400 comprises an operational amplifier based integrated circuit that provides closed loop control of the turn on and turn off of an external FET 402. For example, FET 402 may comprise an N-channel or a P-channel FET. In the given example, gate control circuit 400 comprises an eight pin chip. In some embodiments, FET 402 comprises a power rail switch, and gate control circuit 400 is employed as a control element for switching the power rail. Gate control circuit 400 of FIG. 4 is similar to gate control circuit 300 of FIGS. 3A-3B and/or 330 of FIG. 3C but includes charge pump boost circuitry 403 to locally generate gate voltage. External FET 402, for example, may switch a high voltage rail. If the gate control circuit 400 supply voltage (Vcc) is not sufficient to supply the requisite gate drive, the internal voltage boost supply is employed to obtain the voltage needed to drive the gate during turn-on of FET 402. In some embodiments, local generation of the gate voltage is achieved using charge pump circuitry 403 integrated into gate control circuit 400 to generate the voltage needed to drive the FET gate. In some such cases, charge pump 403 is activated only when needed to generate the required gate drive voltage from the available supply voltage (Vcc). This technique is especially advantageous when driving N-Channel MOSFET switches, where it is necessary to apply a higher voltage value to the gate than the voltage value on the source in order to turn on the FET.

Techniques that increase the efficiency of integrated charge pump power supplies used in gate control circuitry are useful. The efficiency of a charge pump may be increased, for example, by reducing the amount of charge needed to be pumped into the charge pump storage capacitor to achieve the required voltage when needed to drive the gate of a FET. That is, it may be useful to shorten the time it takes to bring a charge pump, e.g., charge pump 403, up to a desired high voltage value to be able to sufficiently apply $V_{GS}$ to achieve low $R_{DS-ON}$. In some embodiments, gate control circuit 400 includes circuitry to pre-charge the charge pump storage capacitor(s) to an appropriate voltage level to minimize or at least reduce the amount of additional charge, if any, required for the voltage necessary to drive the FET gate to the desired level. In some embodiments, a gate control circuit includes circuitry that selects the most appropriate voltage available to the gate control circuit (e.g., either the gate control circuit supply voltage or the FET drain voltage) as the pre-charge voltage of the charge pump storage capacitor such that a minimum additional amount of charge needs to be added to the charge pump storage capacitor to reach the level required to drive the gate of the FET. In some embodiments, the implication of being able to pre-charge the charge pump storage capacitor allows the use of a smaller pre-charge storage capacitor thus saving space and cost.

Consider, for example, that a gate control circuit is used to control an N-Channel MOSFET that is used to switch a 12V bus. In this example, the 12V bus is connected to the drain of the FET, and the source of the FET is connected to a load. From a performance curve of the FET, it may be determined that the gate control circuitry must supply 20V to achieve a $V_{GS}$ sufficient to achieve a minimum $R_{DS-ON}$. If the supply voltage of the gate control circuitry is 5V and if the charge pump uses the supply voltage as the initial pre-charge voltage level on the charge pump storage capacitor, then the storage capacitor of the charge pump must be pumped up an additional 15V to reach the required 20V needed. If, however, the pre-charge voltage of the storage capacitor was 12V (i.e., the drain voltage) instead of 5V, the charge pump would only need to add an additional 8V to reach the required level of 20V. Thus, in this example, it is more efficient to use the drain voltage to pre-charge the charge pump storage capacitor to 12V.

Although not depicted in FIG. 4, gate control circuit 400 includes delay control, slew rate control, and/or discharge rate control circuitry as described above with respect to FIGS. 3A-3C. The operation of gate control circuit 400 is similar to that described for the gate control circuits of FIGS. 3A-3C. As is the case where a charge pump is not integrated, it is important for the control circuitry to perform predictably in cases where either a drain voltage is not yet present or when power to the control circuitry is applied some time after the control signal ON is asserted. When logic signal 404 is asserted from a de-asserted state, voltage is not applied to the gate of FET 402 until expiration of an internally controlled delay period which is set by internal delay control circuitry such as delay control circuitry 320 of FIG. 3B. After the delay period, operational amplifier 406 begins driving FET 402 via application of voltage to the gate of FET 402. Internal slew rate control circuitry, such as slew rate control circuitry 322 of FIG. 3B, controls ramp up of the gate voltage, and in turn the source voltage, of FET 402 as it is turned on. Closed-loop control of FET 402 is facilitated by feedback of the source voltage into operational amplifier 406. The controlled turn-on of FET 402 results in a controlled, monotonic rise in the load supplying source voltage. In some embodiments, the delay period and/or slew rate are device configuration parameters. In some such cases, for example, delay values in the range of 0-3 ms may be selected, and/or source voltage slew rate values in the range of 0.8-8V/ms may be selected. In some embodiments, gate control circuit 400 also includes internal discharge control circuitry, such as discharge control circuitry 324 of FIG. 3B, that controls discharge of the voltage at load 408 when FET 402 is turned off, e.g., in response to logic signal 404 becoming de-asserted and/or shut down signal 405 (SHDN#) becoming asserted. In the example of FIG. 4, shut down signal 405 of gate control circuit 400 provides an asynchronous override to ON signal 404. Although not depicted in the given figures, gate control circuit 300 of FIGS. 3A-3B and/or 330 of FIG. 3C may also include such an asynchronous shut down signal. In some embodiments, the discharge rate is a device configuration parameter. In some such cases, discharge impedance values ranging from 400-1000 Ω equivalent resistance, current limited to a prescribed value of 10 to 50 mA or an open may be selected, and the discharge current may be limited to a maximum prescribed value (e.g., 10 mA).

As depicted in FIG. 4, gate control circuit 400 also includes fault protection circuitry 410. Fault protection circuitry 410 may include circuitry to detect and protect against one or more potential fault conditions. In the given example, fault protection circuitry 410 includes under voltage lock out and over current/temperature shut down circuitry. Under voltage lock out circuitry prevents the device from operating if the device supply voltage (Vcc) is below a prescribed value (e.g., 3.5V). Over current detection circuitry protects against short circuit conditions on the load side of a driven (i.e., on) FET. In some embodiments, the over current detection circuitry monitors the voltage difference between the drain and the source and shuts down the device if $V_{DS-ON}$ exceeds a prescribed value (e.g., 150mV, such as 50 A across 3 mΩ). Similarly, over temperature detection circuitry shuts down the device if the operating temperature exceeds a prescribed value. In various embodiments, once a gate control circuit is shut down due to a fault condition, logic signal 404 must be de-asserted and then re-asserted or Vcc must be turned on or off to clear the fault condition. Although not depicted in the given figures, gate control circuit 300 of FIGS. 3A-3B and/or 330 of FIG. 3C may also include similar fault protection circuitry.

Figure 5:
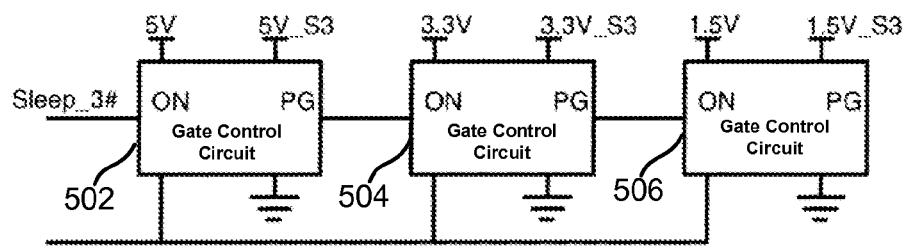
FIG. 5 is a high level functional block diagram of an embodiment of a plurality of gate control circuits daisy chained together.

In some embodiments, a gate control circuit outputs a power good (PG) signal such as PG signal 312 of FIG. 3B and 412 of FIG. 4. In some such cases, after the gate voltage has ramped up and reached its maximum steady state value, the open drain PG signal is asserted. In some embodiments, the PG signal is employed for power-on sequence control of a plurality of switched power rails, e.g., to improve reliability by ensuring that various power rails are turned on in a controlled sequence and to reduce power-on surge current. In such cases, the PG outputs of a series of gate control circuits are used to daisy chain the turn-on of a series of corresponding power FETs. In such a configuration, for example, the PG output of a first gate control circuit is used as the ON input of a second gate control circuit and so on. FIG. 5 is a high level functional block diagram of an embodiment of a plurality of gate control circuits 502-506 daisy chained together. As depicted, the PG signal output by one gate control circuit is input as the ON signal of a next gate control circuit so that corresponding power rails are sequentially switched. In some embodiments, PG signals associated with a plurality of switched power rails are used in a "wired AND" configuration, e.g., to indicate that all are in a power good condition.

Although not depicted in the given figures, gate control circuit 300 of FIG. 3A and/or 330 of FIG. 3C may also include a PG output signal.

Figure 6:
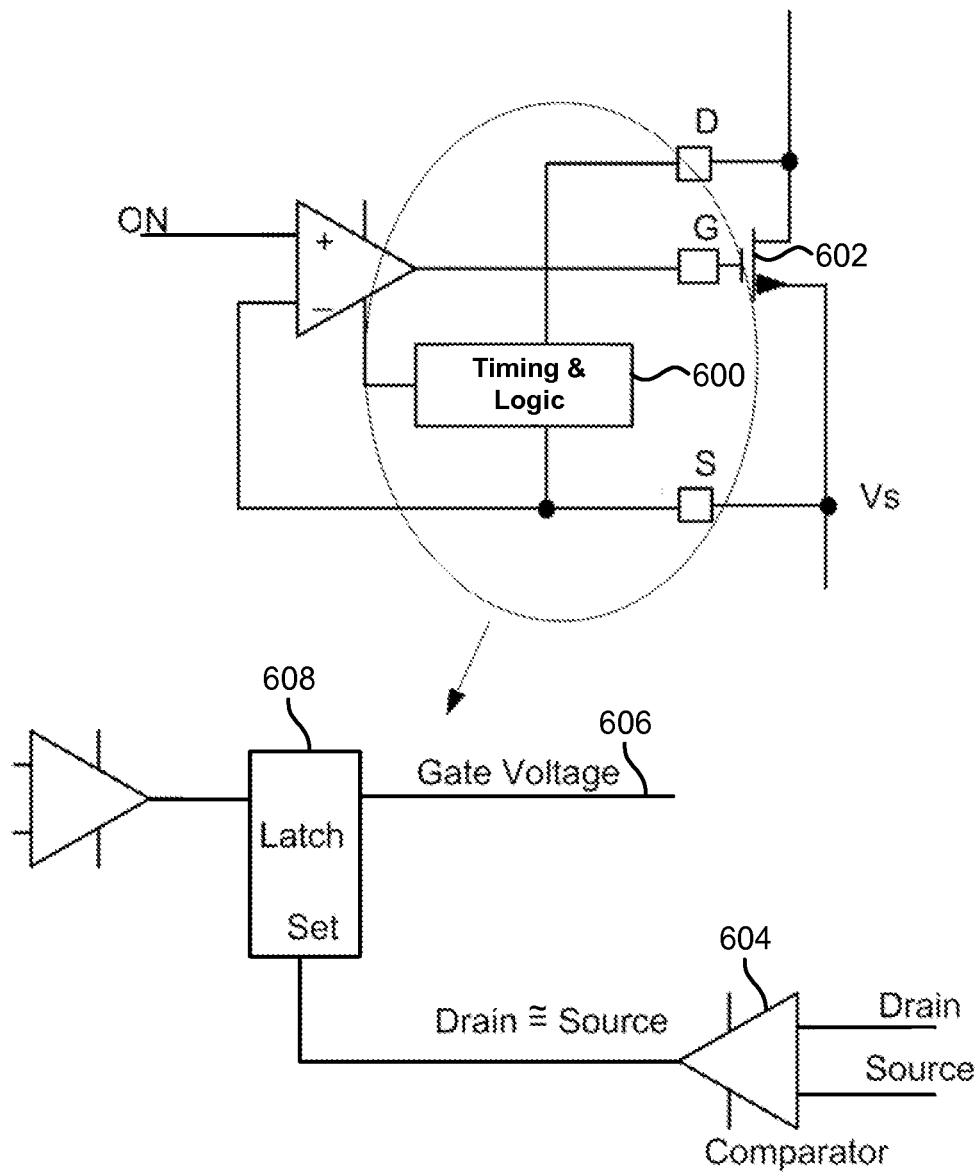
FIG. 6 is a high level functional block diagram of an embodiment of a portion of timing and logic circuitry of a gate control circuit.

Some embodiments of the gate control circuitry described herein result in very low quiescent power consumption. In some cases, no active power but only minor leakage power is consumed when a FET being controlled is either fully turned on or fully turned off. In some embodiments, a latch is employed at the output of the operational amplifier to hold the gate drive voltage either at an on voltage level or at an off voltage level, which results in no active power consumption when the FET is fully on or off. During turn-on, on-chip logic circuitry senses when the FET being driven is fully turned on, e.g., by monitoring the voltage difference between the FET drain and source; latches the output of the operational amplifier when it is determined that the FET is fully turned on to maintain the required gate drive voltage level; and shuts down all other non-essential circuitry in the chip. The latched output can easily supply the small leakage current (e.g., on the order of 100 nA) required to keep the FET turned on. FIG. 6 is a high level functional block diagram of an embodiment of a portion of the timing and logic circuitry of a gate control circuit. Timing and logic circuitry 600 may comprise, for example, timing and logic circuitry 315 of FIGS. 3A-3B and 415 of FIG. 4. One of the functions of timing and logic circuitry 600 is to sense when the FET 602 being controlled is fully turned on. In the given example, comparator 604 is employed to compare the voltage difference between the drain and source of FET 602. Timing and logic circuitry 600 senses that the FET is fully turned on when the voltage difference across the FET after ramp up is very small, i.e., $V_{DS-ON}$ is below a prescribed value. When it is determined that the FET is fully turned on, the gate voltage 606 supplied to FET 602 is latched, i.e., latch 608 is set, to supply the small amount of leakage current required to keep the FET turned on, and the remaining circuitry of the gate control circuit is shut down. Similarly, when the FET is turned off, the output of the operation amplifier is latched, i.e., latch 608 is set, to hold the gate voltage at an off voltage level, and unused circuitry is completely shutdown to eliminate leakage current in sleep, hibernate, and other power saving modes. Thus, in some embodiments, active power is only consumed by the gate control circuit during gate drive, i.e., during ramp up and ramp down, when the output of the operational amplifier is not latched; and latching the output of the operational amplifier when the FET being controlled is fully turned on or turned off results in no active power consumption.

Figure 7A:
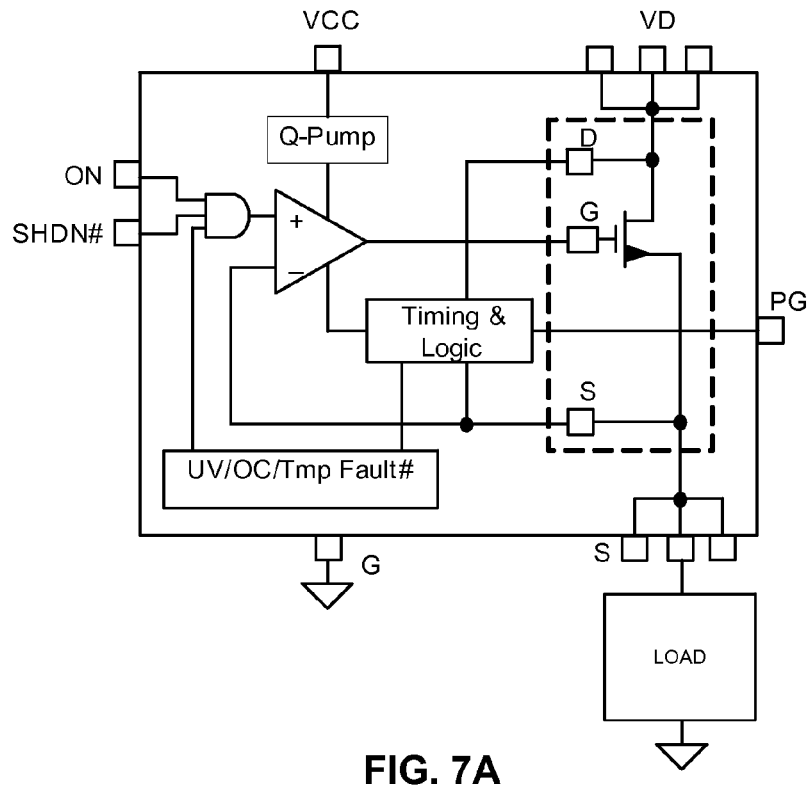
FIG. 7A is a high level functional block diagram of an embodiment of an integrated circuit that includes both a gate control circuit and the FET that it controls.
Figure 7B:
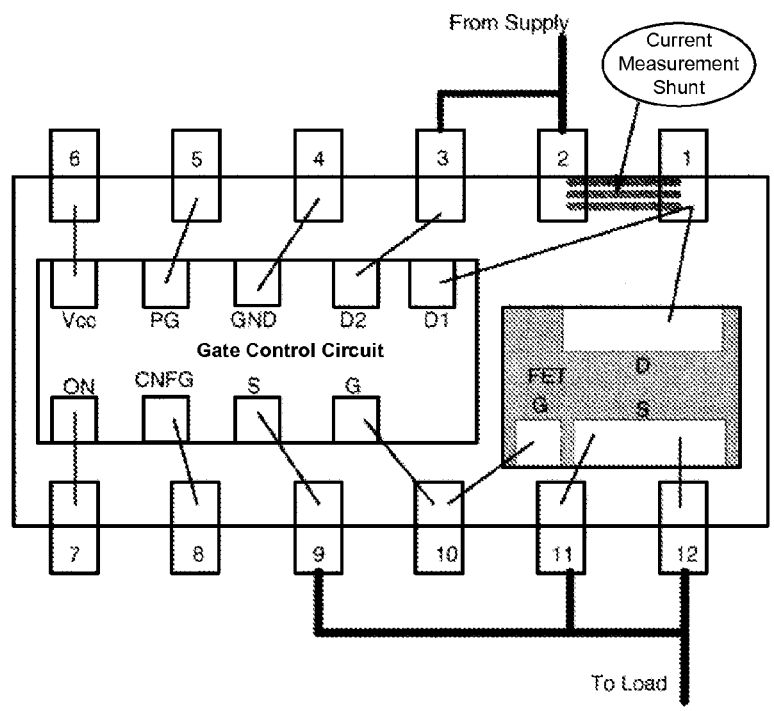
FIG. 7B illustrates an embodiment of the manner in which two die, a FET and a gate control circuit, are packaged in the same chip.

In various embodiments, one or more other circuits, components, and/or structures may be packaged with a gate control circuit in the same integrated circuit chip. In some embodiments, a (power) FET is packaged with a gate control circuit, e.g., in a dual die package assembly. Combining a gate control circuit with the FET that it controls in the same integrated circuit, for example, results in fewer components, traces, and vias on the motherboard of a computer system and assures more predictable switching performance and noise immunity due to much shorter connections. FIG. 7A is a high level functional block diagram of an embodiment of an integrated circuit that includes both a gate control circuit and the FET that it controls. FIG. 7B illustrates an embodiment of the manner in which two die—a FET and a gate control circuit—are packaged in the same chip. The FET and the gate control circuit in FIGS. 7A-7B may be connected via any combination of internal and/or external connections. For example, wire bonding techniques may be employed for internal connections.

In general, FETs are notoriously inaccurate devices whose performance parameters vary significantly across devices. Optimization of the performance of a FET is achievable by determining various parameters of the FET and customizing its drive profile accordingly. In some embodiments, a FET is tested to determine its actual parameters (e.g., on-impedance, input capacitance, gate turn-on threshold, etc.) so that a custom drive profile can be selected for the gate control circuit controlling the FET. In the cases in which the FET is included with the gate control circuit in a hybrid package, for example, testing of the FET is possible during or after manufacturing. In some embodiments, one or more drive profile parameters, FET parameters, and/or other associated data are programmed into non-volatile memory included in the gate control circuit and/or associated integrated circuit.

In some cases, it may be desirable to measure the current through a FET. For example, the currents running through high current power FETs may be on the order of 10-100 A or more, and it may be desirable in such configurations to ensure that load devices are protected from over current conditions. In various embodiments, current may be measured in any appropriate manner, e.g., by dividing voltage by resistance. For example, the voltage through a FET and the impedance of the FET may be employed to determine the current through the FET. In such cases, for instance, a one-time measurement of the impedance (e.g., $R_{DS-ON}$) of a FET may be programmed into non-volatile memory, and the real time voltage (e.g., $V_{DS}$) across the FET may be measured by circuitry included in the gate control circuit to determine the real time current through the FET. With respect to FIG. 7B, the illustrated integrated circuit includes additional structures and/or circuits to measure current. As depicted, a current measurement shunt is constructed between pin 1 and pin 2, e.g., by connecting a lead frame metal strap between the two pins. A one-time measurement of the resistance or impedance between the pins can be programmed into on-chip non-volatile memory. In the given example, pin D1 and pin D2 of the gate control circuit connect to internal circuits within the gate control circuit that measure the real time voltage drop across the shunt structure which is used with the resistance between the pins to determine the real time current flowing through the FET.

Although the integrated circuits of the given examples depict only a single gate control circuit and/or FET, in various embodiments, an integrated circuit may include any number of gate control circuits, FETs, and/or other components, circuits, and/or structures. Moreover, a gate control circuit may include any combination of any other appropriate components, circuits, and/or structures in addition to and/or instead of those described herein.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An integrated circuit for switching a transistor, comprising:
   an operational amplifier configured to switch the transistor;
   delay control circuitry configured to set a programmable delay period prior to transistor turn on; and
   slew rate control circuitry configured to set a programmable ramp rate during transistor turn on;
   wherein the delay period and the ramp rate values are programmable during manufacturing of the integrated circuit.

2. The integrated circuit of claim 1, wherein the operational amplifier is configured to drive the transistor in response to an input signal.

3. The integrated circuit of claim 1, wherein the transistor source voltage is employed as feedback to the operational amplifier.

4. The integrated circuit of claim 1, further comprising discharge control circuitry configured to provide a discharge path when the transistor is switched off.

5. The integrated circuit of claim 1, further comprising a charge pump configured to generate a requisite gate drive voltage for the transistor.

6. The integrated circuit of claim 5, further comprising circuitry to pre-charge a storage capacitor of the charge pump.

7. The integrated circuit of claim 1, further comprising under voltage lock out circuitry.

8. The integrated circuit of claim 1, further comprising over current shut down circuitry.

9. The integrated circuit of claim 1, wherein an output of the operational amplifier is input into a latch and wherein an output of the latch is connected to the transistor gate.

10. The integrated circuit of claim 9, wherein the latch is set when the transistor is fully turned on or fully turned off.

11. The integrated circuit of claim 1, further comprising over temperature shut down circuitry.

12. The integrated circuit of claim 1, wherein the transistor comprises one of a plurality of transistors simultaneously switched by the integrated circuit.

13. The integrated circuit of claim 1, further comprising discharge control circuitry configured to set a programmable discharge rate.

14. The integrated circuit of claim 1, wherein the integrated circuit is part of a series of integrated circuits daisy chained together to facilitate sequential switching of a series of associated power rails.

15. The integrated circuit of claim 1, wherein the transistor is included in the integrated circuit.

16. The integrated circuit of claim 1, wherein the integrated circuit includes circuitry to determine a current across the transistor.

17. The integrated circuit of claim 1, wherein the transistor comprises a Field Effect Transistor (FET).

18. The integrated circuit of claim 1, wherein the transistor comprises a power rail switch.

19. The integrated circuit of claim 1, wherein the integrated circuit comprises a gate driver of the transistor.

20. An integrated circuit for switching a transistor, comprising: an operational amplifier configured to switch the transistor; delay control circuitry configured to set a programmable delay period prior to transistor turn on; and slew rate control circuitry configured to set a programmable ramp rate during transistor turn on; wherein the delay period and the ramp rate values are programmable post fabrication of the integrated circuit.

21. A method for switching a transistor, comprising:
configuring an operational amplifier to switch the transistor;
configuring delay control circuitry to set a programmable delay period prior to transistor turn on; and
configuring slew rate control circuitry to set a programmable ramp rate during transistor turn on;
wherein the delay period and the ramp rate values are programmable during manufacturing of the integrated circuit.

* * * * *